United States Patent
Buchberger et al.

(10) Patent No.: US 8,754,444 B2
(45) Date of Patent: Jun. 17, 2014

(54) RECOMBINATION ZONE BETWEEN DEVICES AND METHOD FOR MANUFACTURING THE SAME

(75) Inventors: Rudolf Buchberger, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 215 days.

(21) Appl. No.: 12/938,769

(22) Filed: Nov. 3, 2010

(65) Prior Publication Data

US 2011/0101463 A1 May 5, 2011

(30) Foreign Application Priority Data

Nov. 4, 2009 (DE) .......................... 10 2009 051 828

(51) Int. Cl.
  *H01L 29/02* (2006.01)
  *H01L 29/167* (2006.01)
  *H01L 29/32* (2006.01)

(52) U.S. Cl.
  CPC .............. *H01L 29/167* (2013.01); *H01L 29/32* (2013.01)
  USPC ............ 257/156; 257/E29.047; 257/E29.086; 257/E29.107; 438/138; 438/618

(58) Field of Classification Search
  CPC .............................. H01L 29/32; H01L 29/167
  USPC ........... 257/368, E21.409, E29.047, E29.255, 257/156, E29.107, E29.086; 438/618, 138
  See application file for complete search history.

(56) References Cited

U.S. PATENT DOCUMENTS

| 3,899,793 | A |   | 8/1975 | Wakamiya et al. |
|---|---|---|---|---|
| 3,988,762 | A |   | 10/1976 | Cline et al. |
| 4,238,761 | A |   | 12/1980 | Schlegel et al. |
| 4,656,493 | A | * | 4/1987 | Adler et al. ................. 257/376 |
| 5,977,569 | A |   | 11/1999 | Li |
| 6,043,516 | A |   | 3/2000 | Schulze |
| 6,723,586 | B1 | * | 4/2004 | Niedernostheide et al. .. 438/133 |
| 7,157,747 | B2 | * | 1/2007 | Mariyama et al. ............ 257/119 |
| 7,199,988 | B2 | * | 4/2007 | Komori et al. ................. 361/42 |
| 7,485,920 | B2 | * | 2/2009 | Francis et al. ............... 257/328 |
| 7,825,492 | B2 | * | 11/2010 | Blanchard .................... 257/544 |
| 2003/0127645 | A1 |   | 7/2003 | Drobnis et al. |
| 2006/0043470 | A1 | * | 3/2006 | Schulze et al. ............... 257/327 |
| 2009/0051001 | A1 |   | 2/2009 | Blanchard |

FOREIGN PATENT DOCUMENTS

| CN | 1508881 A | 6/2004 |
|---|---|---|
| EP | 0 430 237 A1 | 6/1991 |
| EP | 0 833 388 A2 | 4/1998 |

OTHER PUBLICATIONS

Baliga, B. J., "Comparison of Gold, Platinum, and Electron Irradiation for Controlling Lifetime in Power Rectifiers," IEEE Transactions on Electron Devices, Jun. 1977, pp. 685-688, vol. ED-24, No. 6.

* cited by examiner

*Primary Examiner* — John C Ingham
(74) *Attorney, Agent, or Firm* — Slater & Matsil, L.L.P.

(57) ABSTRACT

A semiconductor device includes a first device and a second device, which are implemented laterally next to each other in a substrate. A recombination zone is implemented in the substrate between the first device and the second device, so that diffusing charge carriers recombine between the first device and the second device.

27 Claims, 9 Drawing Sheets

| FIG 7A | FIG 7B |
|---|---|

RECOMBINATION ZONE BETWEEN DEVICES AND METHOD FOR MANUFACTURING THE SAME

This application claims priority to German Patent Application 10 2009 051 828.2, which was filed Nov. 4, 2009 and is incorporated herein by reference.

TECHNICAL FIELD

The invention relates to a semiconductor device and a method for manufacturing a semiconductor device and, in particular, to a method and a structure for manufacturing a triac.

BACKGROUND

For many applications in modern semiconductor process technology it is important, on the one hand, to form semiconductor devices together in as little space as possible in a substrate, but, on the other hand, to prevent charge carriers from drifting from one device into a neighboring device. This drift may, for example, have negative effects on the switching performance of the neighboring device, as charge carriers which have drifted from one device to the next may cause delays (e.g., when switching).

SUMMARY OF THE INVENTION

Embodiments relate to a semiconductor device having a first device, a second device, a substrate and a recombination zone. In the substrate, the first device and the second device are implemented laterally next to each other. The recombination zone is implemented in the substrate between the first device and the second device, so that between the first device and the second device diffusing or drifting charge carriers recombine.

BRIEF DESCRIPTION OF THE DRAWINGS

Embodiments of the present invention are explained in more detail with reference to the accompanying drawings, in which.

DETAILED DESCRIPTION OF ILLUSTRATIVE EMBODIMENTS

Figure 1A:
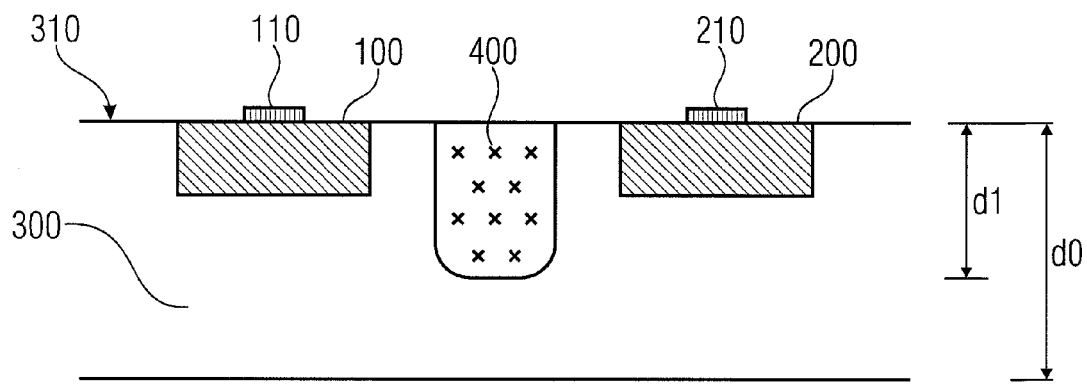
FIGS. 1A and 1B show a sectional view and a top view, respectively, of a semiconductor device according to an embodiment of the present invention.

One effective possibility to prevent charge carrier diffusion is to arrange the two devices initially on two different chips and to subsequently connect the two chips (via external lines). One example relates to so-called photo triac applications in which two thyristors are connected anti-parallely so that they may be connected for current flows in both directions via the gate terminal of the thyristors. In order to enable fast switching operations for the exemplary thyristors, it is important for both thyristors to be insulated as well as possible from each other, which may be achieved, as mentioned above, by the two thyristors being implemented independently on chips. On the other hand, it is advantageous to implement both thyristors required for this on a chip.

As already mentioned above, there is, however, the problem that triacs realized in this way facilitate substantially lower switching speeds than the devices realized on two separate chips. In this example, however, the achievable switching frequency of the conventional one-chip embodiment is substantially lower than for the conventional two-chip embodiment (or dual-chip embodiment). The reason for this is the above-mentioned diffusion of free charge carriers from the switched-on thyristor to the neighboring switched-off thyristor.

A consequence of the slower switching speed of the single-chip solution is that, with an exemplary power frequency of 60 Hz, for example, no more than 30 mA (at 85° C.) may be switched. On the other hand, with the dual-chip variant however, at 60 Hz currents of approximately 300 mA may still be controlled securely. One solution for this problem would, for example, be to connect a more powerful triac downstream which is not required in a dual-chip variant. Due to the clearly higher currents, it is possible in many applications to do without a downstream, more powerful triac.

The replacement of the mentioned dual-chip solution by a single-chip solution would reduce manufacturing costs of the chips by approximately 25% (e.g., for the mentioned triac applications with a blocking voltage of at least 800 V) or by approximately 50% (with a blocking voltage of at least 600 V). For example, reducing the required chip area above can result in these savings.

Thus, there is a need to arrange devices on the one hand, on a chip and, on the other hand, to efficiently suppress the drift of the charge carriers from one device to a neighboring device so that in the exemplary triac application higher current strengths can also be controlled securely with a power frequency of 60 Hz.

One possible solution to prevent the charge carrier drift between two devices which are arranged on a common substrate would be to arrange the devices so far apart that the charge carriers are not able to overcome the distance between the devices, at least not within a time period which is given, for example, by the operating frequency (more accurately, the inverse operating frequency). This means that it would be possible to increase the current distance between the two exemplary thyristors within the triac so much that the charge carriers are not able to get from the one thyristor to the other thyristor during the operation. This would, however, lead to a substantially higher space requirement and thus have no cost advantage as compared to the dual-chip solution. Thus, this obvious solution of the above-described problem is hardly sensible.

Thus, embodiments of the present invention take a different route. A recombination-effective layer extended sufficiently in a vertical direction is generated between two devices accommodated on the chip (for example, two thyristors connected in an anti-parallel way). The recombination-effective layer or structure (recombination zone) may, for example, be generated by a structural change of the semiconductor, so that charge carriers may change from the conduction band into the valence band by emitting photons or phonons (recombination).

The respective charge carriers are thus bound and are no longer available as free charge carriers for a current flow. This may, for example, be generated by means of defects in the crystal structure of the semiconductor which, as is conventional in recombination, lead to energy levels which lie between the conduction band and the valence band and thus enables the transition from the conduction into the valence band for the charge carriers. Specifically, generating the defects may, for example, be done by an irradiation (e.g., with protons, helium atoms, neutrons or electrons), which leads to vacancies, where one or several semiconductor atoms are missing, being generated in the crystal lattice. Alternatively, at the vacancies oxygen may be taken up, so that oxygen/vacancy complexes form. The formation of multi-vacancies is also possible, where several lattice atoms are removed from the crystal lattice and take on intermediate lattice positions. Heavy metals, like, for example, platinum or gold, may also be diffused locally into the crystal structure in order to form recombination-effective centers.

Thus, embodiments provide a semiconductor device having a first device and a second device which are implemented laterally next to each other in a substrate. A recombination zone is implemented in the substrate between the first and the second device and separates devices by recombining charge carriers diffusing between the first and second device.

As an example, in the following, embodiments of the present invention are to be explained with reference to thyristors for the first and the second device, which are, for example, connected in an anti-parallel way in order to form a triac. The use of the thyristors for the first and the second device is only one example, however, and embodiments should not be limited to the same.

Between the two adjacent exemplary thyristors connected in an anti-parallel way, a narrow zone of increased recombination extended in a vertical direction is generated (recombination zone). As mentioned above, this zone has a sufficient extension to achieve the described effect (prevention of charge carrier diffusion). If the substrate comprises a thickness of approximately 300 µm, for example, the recombination zone typically ought to comprise a vertical extension of 10 to 250 µm (or 3%-90% of the substrate thickness) or of 50 to 150 µm (or 20%-50% of the substrate thickness), so that the charge carriers may only bypass the recombination zone with difficulty or not at all and the laterally diffusing free charge carriers are induced to a recombination. The lateral extension of this recombination zone is limited, for example, to the electrically inactive area between the two thyristors connected in an anti-parallel way (the first and second device).

The mentioned recombination zone may, for example, be generated by means of a local irradiation (of the triac) with highly energetic light-weight particles, wherein, in particular, protons are suitable as particles as they comprise a relatively high range in the substrate. In the irradiation, optionally a mask may be used which, for example, masks the two thyristors and merely leaves the area of the recombination zone for an irradiation, wherein, for example, a so-called stencil mask may be used. The stencil mask may, for example, be implemented by means of a silicon disc with suitable holes or also as stripes. In the irradiation it is sensible for the area to be irradiated on the front side to be free from cover layers, like oxide layers, doped or undoped silicate glass or polyimide, during irradiation to prevent unwanted irradiation with highly energetic implantation. If required, for example, after irradiation a polyimide layer may be deposited, wherein the process temperature should not exceed 350° C., for example, as the recombination-effective effects generated by the irradiation, such as, for example, the double vacancies or oxygen/vacancy complexes, are substantially annealed at these temperatures. For example, tempering or temperature treatment may take place for stabilizing the defects after the irradiation in a range between 150 and 350 or in a range between 200 and 320° C. Using this temperature treatment, the generated recombination-effective centers are stabilized, so that possible annealings are prevented during the operation of the device.

Alternatively, for the generation of the recombination zone, also an irradiation by means of electrons may take place, wherein due to the higher penetration depth of the electrons the depth of the recombination zone may approximately comprise the thickness of the substrate. It is further possible to generate the recombination zone by means of recombination-effective heavy metals like, for example, platinum or gold which are diffused or implanted and subsequently diffused in the recombination zone in the semiconductor substrate. When using heavy metals for generating recombination-effective defects, the temperature treatment may, for example, be executed in a temperature range between 700 and 900° C., for example, between 15 minutes and 6 hours or between 30 minutes and some hours. Also this temperature treatment finally serves for stabilizing the defects, so that during the operation no annealing of the effects takes place and a stable operation is achieved.

One possible radiation dose for the used radiation may, for example, be between $10^{11} \ldots 10^{14}$ protons per cm$^2$ or between $10^{12}$ and $10^{13}$ protons per cm$^2$. It is also possible to let several radiation steps one after the other have an effect on the substrate, wherein the individual irradiation steps may comprise different energies and/or different doses. When using proton irradiation, for example, an energy of approximately 2 MeV to 4 MeV may be used or be in a range between 1 . . . 10 MeV.

In further embodiments it is also possible to form trenches, pores or other structures in the semiconductor which also efficiently suppress or prevent the drift (diffusion) of the free charge carriers between the first and the second device. The trenches or pores may, for example, be filled with oxides, metals or polysilicon. In further embodiments it is also possible to implement the trenches on the back side of the substrate, for example, at the location of the recombination zone. Thus, the cross-section of a drift path between the first and the second device which is available for free charge carriers is further reduced. Optionally, it is also possible to irradiate the back side, wherein here, however, an irradiation of the complete side would be possible and the irradiation depth of the back side may, for example, be selected such that, on the one hand, no negative influence on the first and second device is caused and, on the other hand, a contact to the recombination zone is made, so that along the complete substrate thickness a charge carrier transport between the first and the second device becomes impossible. In further embodiments it is also possible that from the back side one or several trenches are formed and simultaneously an irradiation takes place from the back side, so that along the trenches a higher irradiation depth is effectively achieved. When using these trenches, the above-described goal, i.e., as low an influence as possible on the first and second device, with a simultaneous closing of possible current paths between the first and the second device, may be achieved.

Advantages of embodiments thus include that, on the one hand, a first and a second device may be arranged very closely on the same substrate and that, on the other hand, a drift of charge carriers between the first and the second device is efficiently prevented. The suppression of the charge carrier transport between the first and the second device is executed by recombination, as mentioned above, in contrast to an increased distribution of charge carriers within a distribution zone. When forming a distribution zone, a current flow would only be decelerated by an increase of the resistance. The recombination does not lead to a slowing down of the current flow by diffusion at diffusion centers between the first and the second device, but to a ceasing of the current flow, as the recombination zone acts as a charge carrier well.

It is thus possible in embodiments to use the above-mentioned cost advantage which results from the two devices being implemented on the same chip on a very small space, and wherein thus a chip area saving results.

Figure 1B:
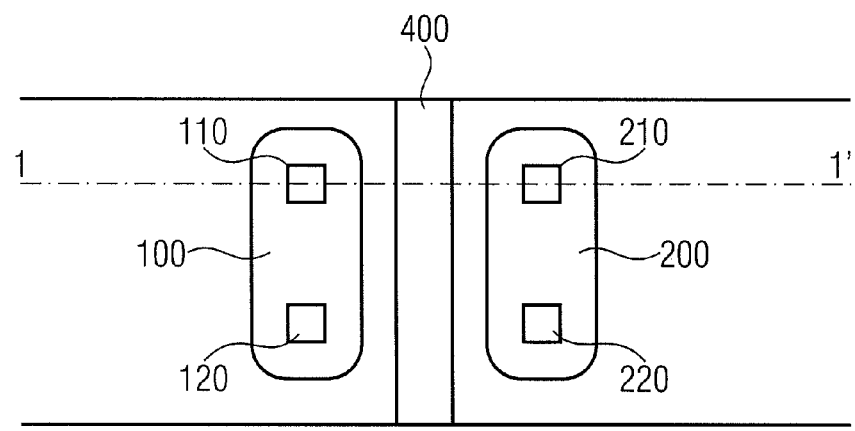

FIGS. 1A and 1B show a sectional view through and a top view onto the semiconductor device according to a first embodiment.

FIG. 1A shows the semiconductor device with a first device 100, a second device 200, a substrate 300 and a recombination zone 400. The first and second devices 100, 200 are implemented laterally next to each other in the substrate 300, and the recombination zone 400 is implemented in the substrate 300 between the first device 100 and the second device 200, so that between the first device 100 and the second device 200 diffusing charge carriers recombine.

The first device 100 may, for example, include a bipolar semiconductor device (e.g. a thyristor). The second device 200 may also comprise a bipolar device, like, for example, a second thyristor. Both the first and the second device 100, 200 may thus be switchable devices with one anode terminal and one cathode terminal each. The switching may here take place via a control terminal (e.g., a gate) or also optically. For example, in FIG. 1A a first terminal 110 of the first device 100 and a first terminal 210 of the second device 200 are illustrated. The substrate 300 comprises, for example, a layer thickness d0, wherein the layer thickness d0 may, for example, be in a range between 200 µm and 500 µm or be approximately 300 µm. The recombination zone 400 comprises a depth d1 vertical to the substrate surface 310, wherein d1 may, for example, be in a range between 20 and 300 µm or between 50 and 150 µm. Both the first device 100 and also the second device 200 are thus arranged and contactable laterally next to each other along the substrate surface 310. The terminals may also be implemented as contact terminals.

FIG. 1B shows a top view onto the semiconductor device, as is illustrated in FIG. 1A. The sectional line 1-1' in FIG. 1B here shows the cross-sectional plane, as is illustrated in FIG. 1A. In FIG. 1B it may thus be gathered that the first device 100 and the second device 200 are implemented laterally next to each other in or at the substrate 300 and that the first device 100 comprises the first terminal 110 and a second terminal 120 which may also be contacted from the surface 310. Likewise, the second device 200 comprises the first terminal 210 and a second terminal 220 which may also be contacted from the surface 310 of the substrate 300. Between the first device 100 and the second device 200 the recombination zone 400 is implemented.

As may be seen from FIG. 1A, the recombination zone 400 comprises a depth d1 which is, for example, greater than the electrically active regions R1, R2 of the first and the second device 100, 200 (hatched region in FIG. 1A). The recombination zone 400 thus illustrates a well for the charge carrier transport, so that the remaining charge carriers between the first and the second device 100, 200 may no more than flow past the well (recombination zone 400) if the diffusion path is not completely interrupted by the barrier.

Figure 2:
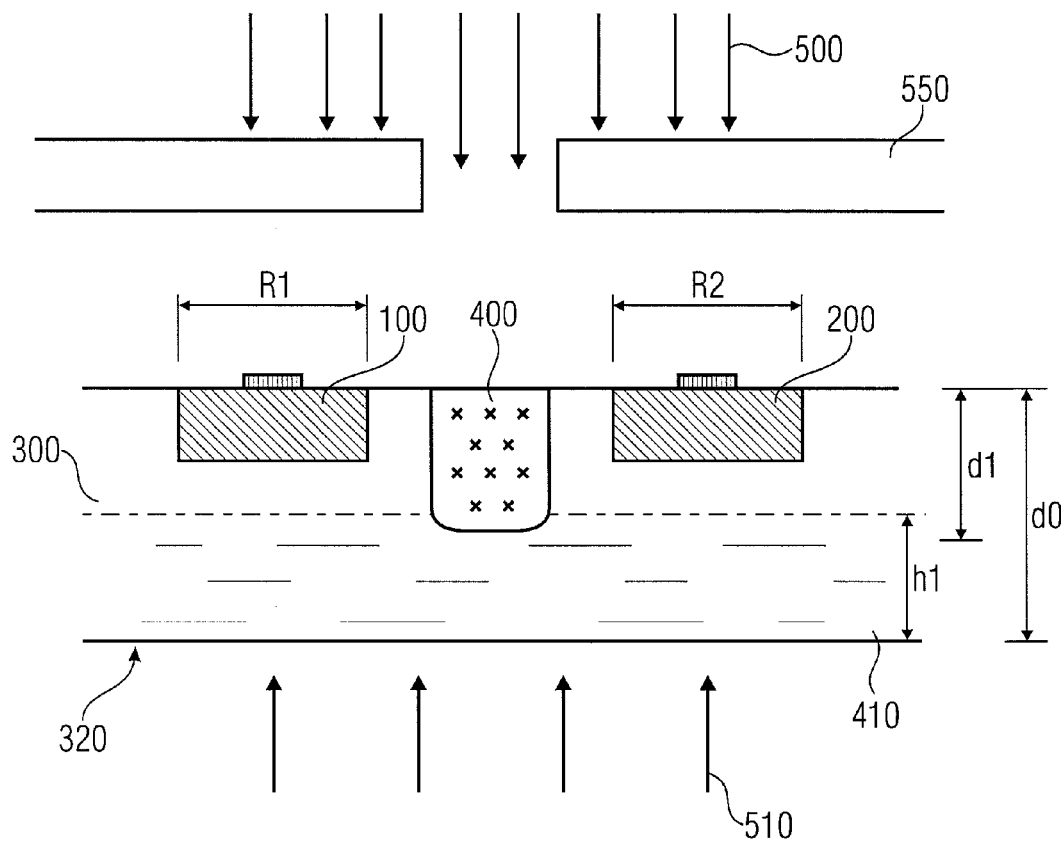
FIG. 2 shows a sectional view having an optional rear-side irradiation area.

FIG. 2 shows a further sectional view through the semiconductor device comprising the first device 100 and the second device 200 and the recombination zone 400. As illustrated in FIG. 2, the recombination zone 400 may, for example, be generated by means of an irradiation 500, wherein the area of the recombination zone 400 is defined by means of a mask 550. The mask 550 here protects the active region R1 of the first device 100 and the electrically active region R2 of the second device 200, so that both the first device 100 and also the second device 200 are protected from the irradiation 500 and may thus not be limited by the irradiation 500 regarding their operation. The irradiation 500 may be rated according to its energy and also according to its dose, so that the recombination zone 400 extends to a depth d1 in the substrate 300, wherein the depth d1 is selected as described above.

Optionally, it is also possible to expose the substrate to an irradiation 510 from a back side 320. The back-side irradiation 510 thus leads to the formation of a back-side recombination layer 410 which may, for example, extend both below the recombination zone 400 and also below the first device 100 and the second device 200. For example, the complete substrate 300 may be irradiated by means of a back-side recombination zone 410. The selected energy for the back-side recombination zone 410 and also the dose may, for example, be selected such that the back-side recombination layer 410 extends up to a height of h2, so that d1+h2 is greater than d0 (layer thickness of the substrate).

The optional back-side irradiation 510 (e.g., also with protons) has the purpose of a further reduction of a cross-section of the drift path of free charge carriers between the first device 100 and the second device 200. The back-side irradiation 510 may, for example, be executed onto the whole area of the uncovered silicon back side. The irradiation energy of the back side irradiation 510 and also its dose may, in this case for the whole area, be selected or optimized such that the operation of the first and the second device 100, 200 is not affected. For example, the forward voltage for the case that the first and the second device 100, 200 are thyristors, should not be increased unnecessarily strongly. The irradiation energy may, for example, be in a range between 2 and 4 MeV.

When using a proton irradiation for the irradiation 500 and/or for the back-side irradiation 510, a maximum energy may, for example, be approximately 4 MeV, which, for example, causes a range of the protons of approximately 150 µm. If required, also several or different irradiation energies may be used to increased the recombination efficiency of the recombination zone 400. The dose of the irradiation (proton dose) which causes a sufficient recombination efficiency is typically in a range of some $10^{12}$ to some $10^{13}$ hydrogen atoms per $cm^2$.

Figure 3:
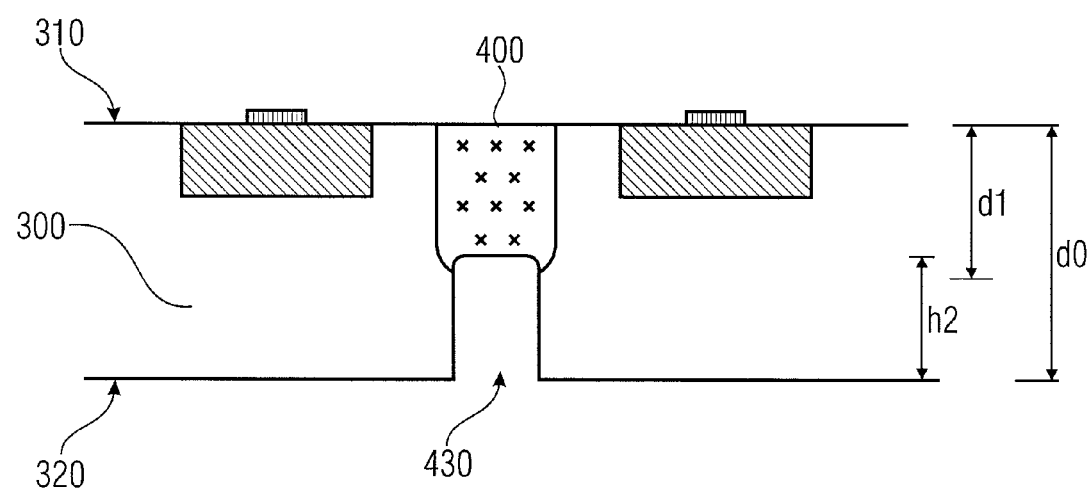
FIG. 3 shows a sectional view through a semiconductor device having an optional rear-side trench.

FIG. 3 shows a further embodiment of the semiconductor device, wherein instead of the back-side irradiation 510, as illustrated in FIG. 2, from the back side 320 a trench 430 is formed. The trench comprises, for example, a depth d3 (measured from the back side 320), which may, for example, be selected such that d3+d1 is greater than d0. This means that the trench 430 extends, for example, up to a depth from the back side 320 until it contacts the recombination zone 400. On the other hand, first of all the trench 430 may be formed with the depth d3 and subsequently an irradiation 500 may take place from the surface 310 of the substrate 300 which is rated such that the depth of the recombination zone d1 is so large that it extends to the trench bottom. Thus, it is possible to achieve a complete interruption of the diffusion.

Figure 4:
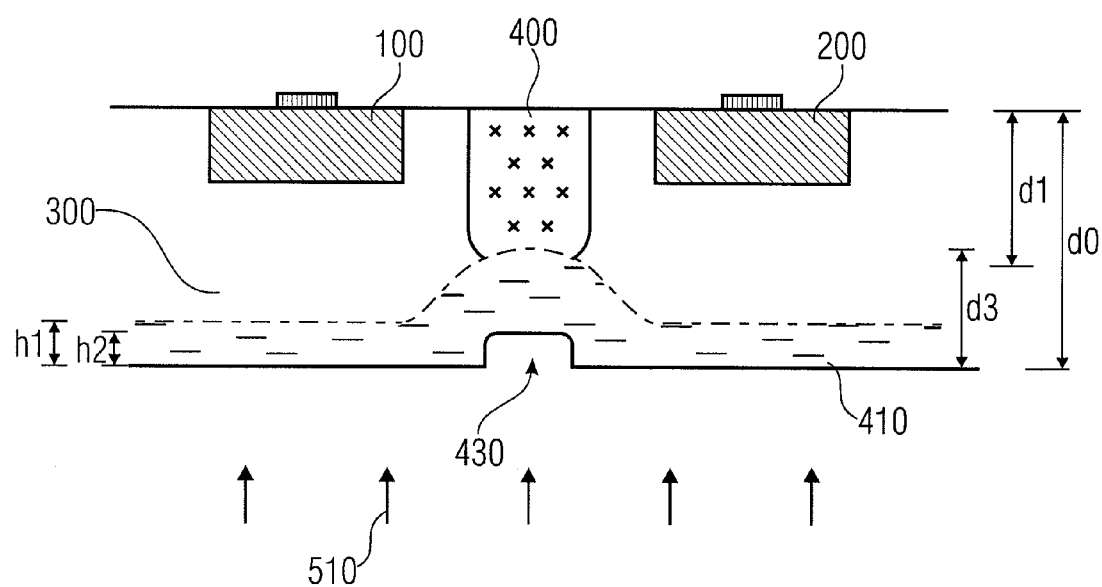
FIG. 4 shows a sectional view through a semiconductor device having the optional rear-side trench and the irradiation area.

FIG. 4 shows a further embodiment, wherein the trench 430, as it is illustrated in FIG. 3, and the back-side irradiation 510, as it is illustrated in FIG. 2, are combined with each other. Thus, in the embodiment as is illustrated in FIG. 4, also from the back side 320 a trench 430 is formed comprising a depth h2. Additionally, a back-side irradiation 510 is executed which leads to a back-side recombination layer 410 with a depth h1 being formed. Advantageously, the back-side irradiation 510 is executed after forming the trench 430, so that the back-side irradiation 510 may penetrate the substrate 300 more deeply at the location of the trench 430 and basically at this location a contact to the recombination zone 400 may be made. This again leads to an efficient interruption of the charge carrier drift. In further embodiments, however, the provision of a contact between the back-side recombination layer 410 and the recombination zone 400 is not made, but only the cross-section of a possible recombination-free diffusion path between the first device 100 and the second device 200 was reduced such that no or only relatively few charge carriers may diffuse between the devices any more (as mentioned, a diffusion through the recombination zone 400 is not possible or very limited due to the recombination taking place there).

Figure 5:
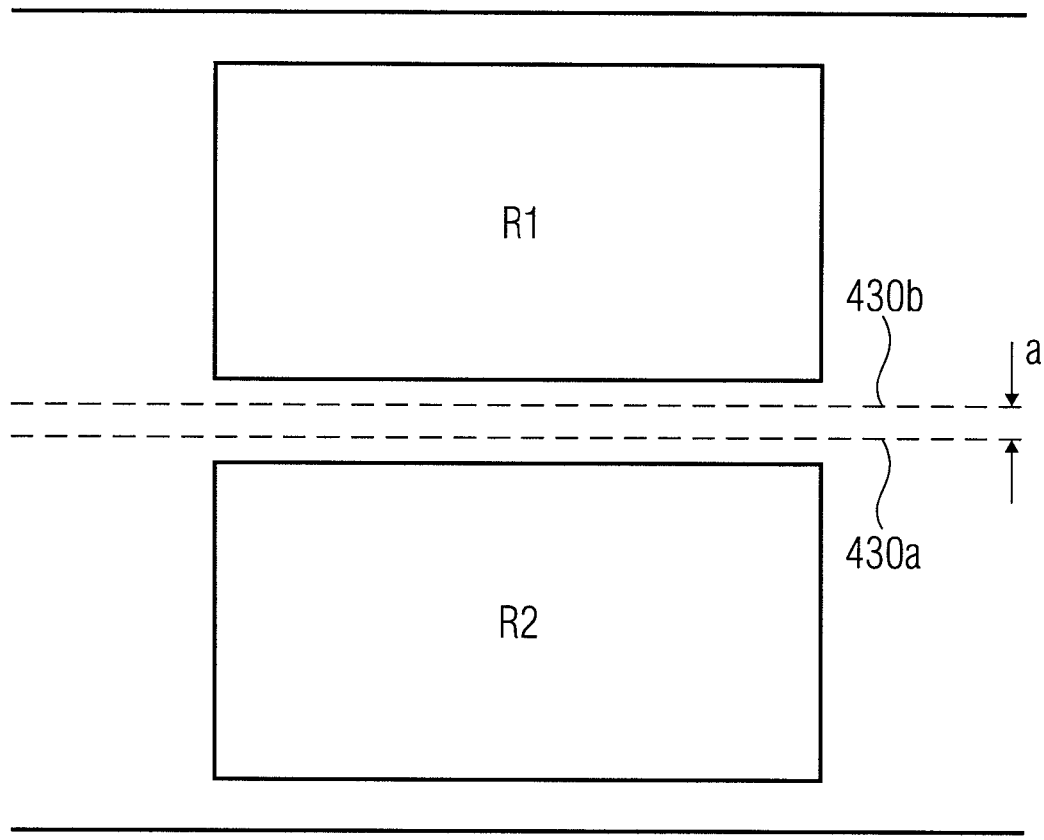
FIG. 5 shows a rear-side view of the substrate having implemented trench structures.

FIG. 5 shows a view onto the back side 320 with the electrically active region R1 of the first device 100 and the electrically active region R2 of the second device 200 (the devices are not illustrated in FIG. 5). Between the electrically active regions R1 and R2, in the embodiment as illustrated in FIG. 5 a first trench 430a and a second trench 430b are formed. Both the first trench 430a and also the second trench 430b may, for example, be formed continuously laterally, wherein the trenches 430a and 430b run in parallel to the recombination zone 400, for example. Alternatively, it is also possible, however, to form the first trench 430a and/or the second trench 430b interrupted laterally, whereby also an efficient suppression of a current flow between the electrically active region R1 of the first device 100 and the electrically active region R2 of the second device 200 is guaranteed. As illustrated in FIG. 5, in this respect the first trench 430a and the second trench 430b may be interrupted offset from each other and comprise a lateral distance a to each other. The depths and widths of the trenches 430 may again be selected such that they have no or extremely little influence on the operation of the first and the second device 100, 200.

The embodiments illustrated in FIGS. 3 to 5 thus lead to the fact that the penetration depth of the back-side irradiation 510 (e.g., by means of protons) is locally increased (h1+h2 in FIG. 4). Here, as mentioned above, from the disc back side 320 trenches were etched in the areas below the recombination zone 400 into the substrate 300 (or plate), wherein their depth is, for example, rated such that the sum of the penetration depth of the irradiated protons and the trench depth is somewhat less than the plate thickness d0. The depth h2 of the trenches 430 may, for example, be in a range between 10 and 100 μm, whereby, for example by the front-side irradiation, a contact may be made between the irradiated regions. The trench depth h2 should be rated here such that the irradiated exemplary protons in the non-etched back-side area 320 do not negatively change the electric characteristics of the first device 100 and the second device 200. Likewise, it is possible that a trench which is continuous in a lateral direction is generated in an area between the two devices 100, 200 (e.g., thyristors connected in an anti-parallel way), or that also several trenches interrupted in the lateral direction which are not too far apart are generated, wherein the distance between the trenches may, for example, be in a range between 5 μm and 100 μm or in a range between 10 μm and 50 μm. The back-side irradiation may optionally also be executed using a mask.

Instead of the used proton irradiation, it is also possible to execute on the front side (from the surface 310 of the substrate 300) a masked electron irradiation for generating the desired recombination zone 400. In the case of high electron energies, in this case, however, the application of a relatively thick mask may be required to achieve an efficient shielding of the first and the second device 100, 200. The use of the electron irradiation would be advantageous, however, as the recombination zone 400, already with relatively low irradiation energies, would lead to a complete through-irradiation of the semiconductor plate (of the substrate 300). As with the use of electrons the same type of defect centers is generated as with the use of protons, in both cases the same annealing conditions may be used, as was described above.

A further possibility for generating the recombination zone 400 is the above-described indiffusion of recombination-effective heavy metals like, for example, platinum or gold. This may take place on the front side and/or from the back side, wherein optionally a mask is applied. In this respect, in the area of the targeted recombination zone 400 a platinum silicide layer may be generated, for example, locally. The platinum atoms are here, at suitable temperatures, in a range between 700° C. and 900° C., indiffused into the area of the recombination zone 400 to be generated. Typical diffusion times here lie in a range between 30 minutes and some hours. If required, this embodiment may be combined with the back-side proton irradiation of the whole area.

Figure 6A:
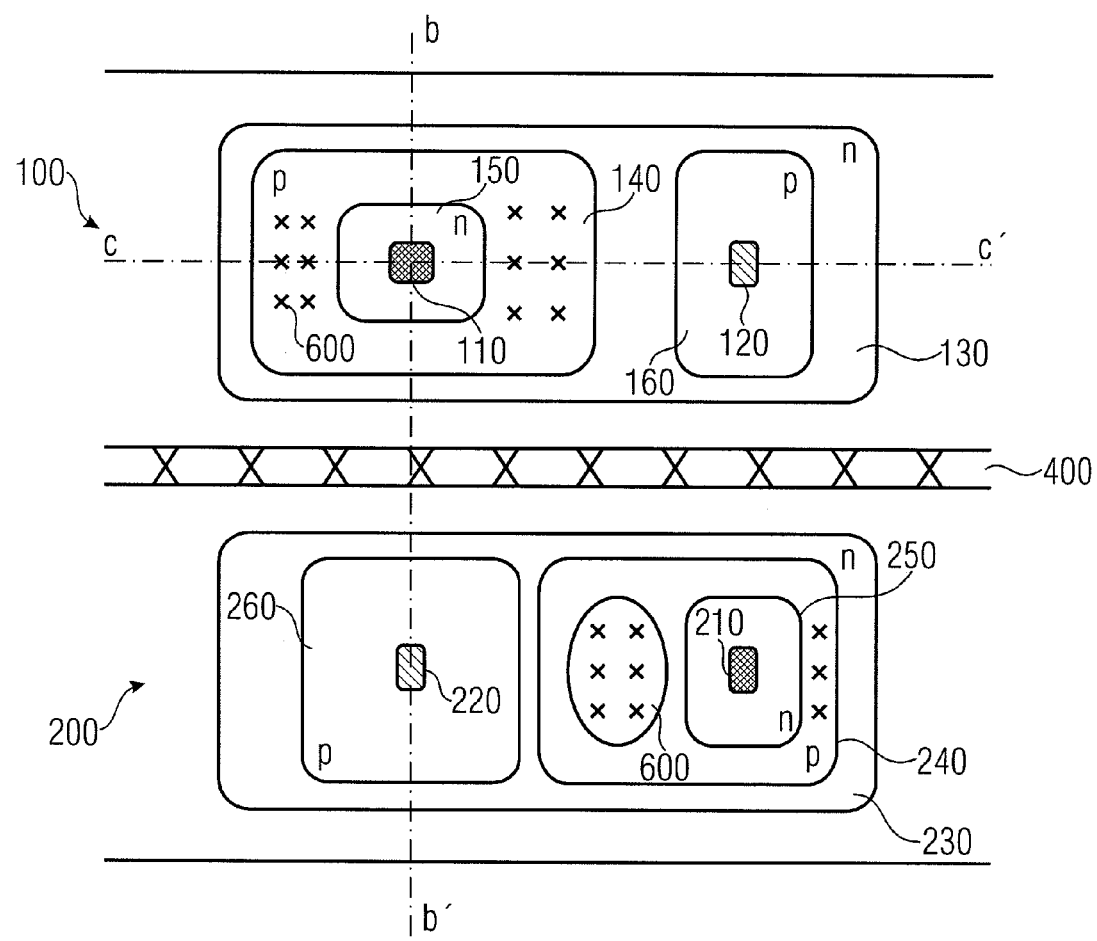
FIGS. 6A to 6C show a top view and two sectional views, respectively, through a triac according to embodiments.
Figure 6B:
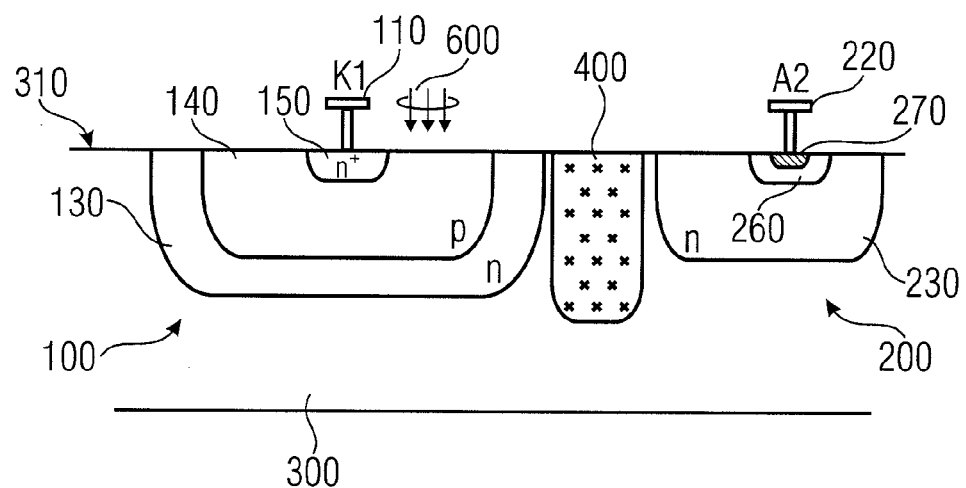
Figure 6C:
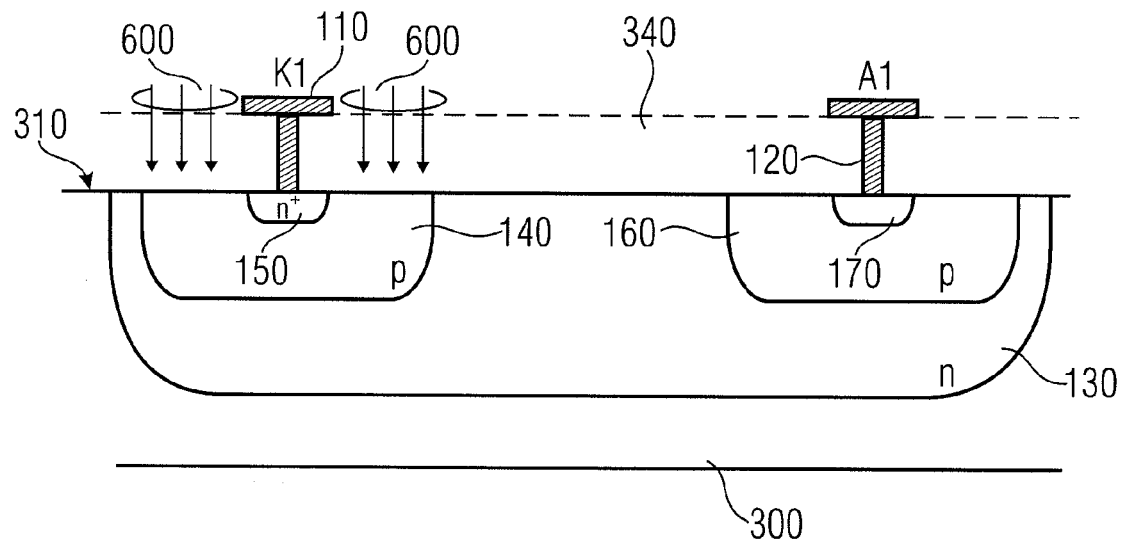

FIGS. 6A to 6C show a top view and two sectional views of an embodiment, wherein the first device 100 is a first thyristor and the second device 200 is a second thyristor.

FIG. 6A shows the top view onto the surface 310 of the substrate 300, wherein the first thyristor 100 and the second thyristor 200 are separated by the recombination zones 400. The first thyristor 100 comprises a first doped area (e.g. n-doped) 130, a second (complementary) doped area 140 (e.g., p-doped), a third doped area 150 (e.g., n-doped) and a fourth (complementary) doped area 160 (e.g., p-doped). The doped areas are here arranged such that the second doped area 140 and the fourth (complementary) doped area 160 are implemented next to each other within the first doped area 130. The third doped area 150 is implemented within the second doped area 140. Apart from that, the first thyristor 100 comprises a first terminal 110 electrically connected to the third doped area 150 and apart from that a second terminal 120 connected to the fourth doped area 160. The first terminal 110 may be connected (not shown) to a first contact and the second terminal 120 to a second contact.

The second thyristor 200 located on the laterally opposing side of the recombination zone 400 comprises the same structures which were, however, mirrored along a line perpendicular to the recombination zone 400. Accordingly, the second thyristor 200 also comprises a first doped area 230 (e.g., n-doped), a second (complementary) doped area 240 (e.g., p-doped), a third doped area 250 (e.g., n-doped) and a fourth (complementary) doped area 260 (e.g., p-doped). The second doped area 240 is again implemented laterally next to the fourth doped area 260 in the substrate 300, wherein both the second doped area 240 and also the fourth doped area 260 are implemented in the first doped area 230 as a well. Likewise, the third doped area 250 is electrically connected to the first terminal 210 and the fourth (complementary) doped area 260 is connected to the second terminal 220. The first terminal 210 may again be connected to a first electrode and the second terminal 220 to a second electrode. The electrical connection may be implemented by means of metallizations or metal layers.

The first doped areas 130, 230 of the first and the second thyristor 100, 200 are thus implemented as n-wells in the substrate 300 and separated from each other by the recombination zone 400. The substrate 300 itself may, for example, be weakly p-doped. The selected doping for the individual areas/substrate are only an example and may be selected differently in further embodiments.

In the embodiment illustrated in FIG. 6A, the first thyristor 100 and the second thyristor 200 are implemented as photo thyristors so that their ignition by means of a light signal (or generally an optical signal) takes place in an optical window 600 serving as a gate. The optical window 600 is here, for example, implemented in the second (complementary) doped area 140, 240 which acts as a photo cell. The charge carriers released by the optical signal thus cause the ignition of the respective thyristor so that it is open for a current flow between the first terminal 110 and the second terminal 120. The pn transition, for example, between the third doped area 150 and the second (complementary) doped area 140, thus acts as a photo cell and the ignition takes place optically. The ignition may, however, alternatively also take place via a gate contact contacting the p-doped base zone 140.

FIG. 6B shows a cross-sectional view along the cross-sectional line b-b' (see FIG. 6A). From FIG. 6B it may thus be gathered that within the substrate 300 the recombination zone 400 between the first thyristor and the second thyristor is implemented in the substrate 300. As may be gathered from FIG. 6B, the third doped area 150 is implemented as a well within the second (complementary) doped area 140 in turn implemented as a well within the first doped area 130. Likewise, the first doped area 230 of the second thyristor is implemented as a further well offset laterally to the first doped area 130 of the first thyristor 100 and contains the fourth doped area 260 of the second thyristor 200. Optionally, the fourth doped area 260 of the second thyristor 200 may comprise a highly doped terminal region 270 comprising the same doping as the fourth doped area 260 and having the purpose of an efficient electrical contact to the second terminal 220.

The first contact terminal 110 of the first thyristor 100 generates, as mentioned above, an electrical contact to the third doped area 150 and forms, for example, a cathode terminal K1. Both the first terminal 110 and also the second terminal 220, for example, forming an anode terminal A2 of the second thyristor 200, may, for example, be implemented as a through-contacting (via-contact) overcoming an optional oxide layer implemented along the surface 310 of the substrate 300. The ignition of the thyristor, as is indicated in FIG. 6A, takes place, for example, by means of an optical signal in the region 600 (optical window) which, due to the photoelectrical effect, leads to the charge carriers in the second (complementary) doped area being released and in turn leading to the ignition of the thyristor (the first or second thyristor).

FIG. 6C shows a further cross-sectional view along the sectional line c-c' (see FIG. 6A). Thus, FIG. 6C shows a sectional illustration through the first thyristor 100 which is implemented in the substrate 300. From FIG. 6C it may thus be gathered that the first doped area 130 is implemented as a well enclosing both the second (complementary) doped area 140 and also the fourth (complementary) doped area 160 laterally next to each other. Further, the third doped area 150 is implemented as a well within the second (complementary) doped area 140. Thus, from the first terminal 110 electrically contacting the third doped area 150 and the second terminal 120 contacting the fourth (complementary) doped area 160 (for example, via a terminal region 170), an npnp transition results, wherein, for example, the third doped region 150 is n-doped, the second (complementary) doped region 140 is p-doped, the first doped region 130 is n-doped and the fourth (complementary) doped region 160 is p-doped. The terminal region 170 may, for example, also be p-doped, wherein the doping of the terminal region 170 is clearly above the doping of the fourth doped area 160. An optional oxide layer 340 is, for example, formed on the substrate surface 310, and both the first contact terminal 110 and also the second contact terminal 120 are, for example, implemented as so-called vias through-contacting an optional oxide layer 340. Thus, for example, above the oxide layer 340 the cathode terminal K1 and the anode terminal A1 are implemented. The oxide layer 340 may, for example, be implemented translucently, so that an optical window 600 results which enables that incoming light within the second (complementary) doped area 140 generates free charge carriers via the photo electrical effect which switch the first thyristor 100 in a forward direction. Thus, a current path from the first contact terminal 110 (e.g., cathode K1) to the second contact terminal 120 (e.g., anode A1) is formed. The substrate 300 may, for example, comprise silicon, and the first doped region 130 (e.g., n-well) may, for example, comprise a thickness which is smaller than the penetration depth d1 of the recombination zone 400, which is not illustrated in FIG. 6C (see FIG. 6B).

To obtain a triac, the first terminal 110 of the first thyristor 100 is electrically connected to the second terminal 220 of the second thyristor 200, and the second terminal 120 of the first thyristor 100 is electrically connected to the first terminal 210 of the second thyristor 200. Thus, the first thyristor 100 is connected in an anti-parallel way to the second thyristor 200 by the cathode terminal of the first thyristor 100 being electrically connected to the anode terminal of the second thyristor and the anode terminal of the first thyristor 100 also being electrically connected to the cathode terminal of the second thyristor. It is thus guaranteed that for each current direction (e.g., when applying alternating current) either the one thyristor or the other thyristor is switched into a forward direction regarding the incident light. Optically switching by means of a light signal here has the advantage that simultaneously a galvanic decoupling of the control signal from the load circuit results, which may, for example, comprise a clearly higher voltage or current strength than the control circuit.

Figure 7A:
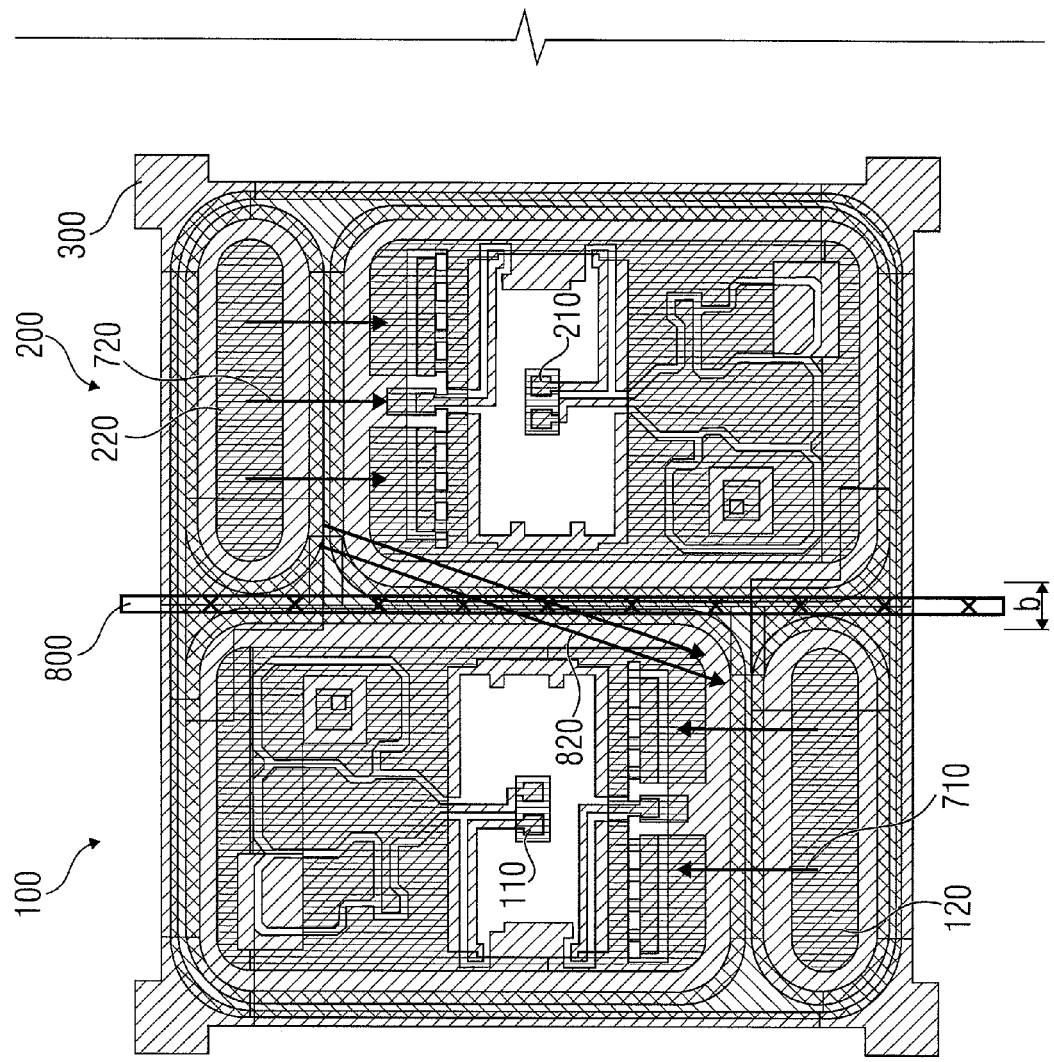
FIG. 7, which includes FIGS. 7A and 7B as shown, shows a layout view of the triac according to embodiments.
Figures 7, 7B:
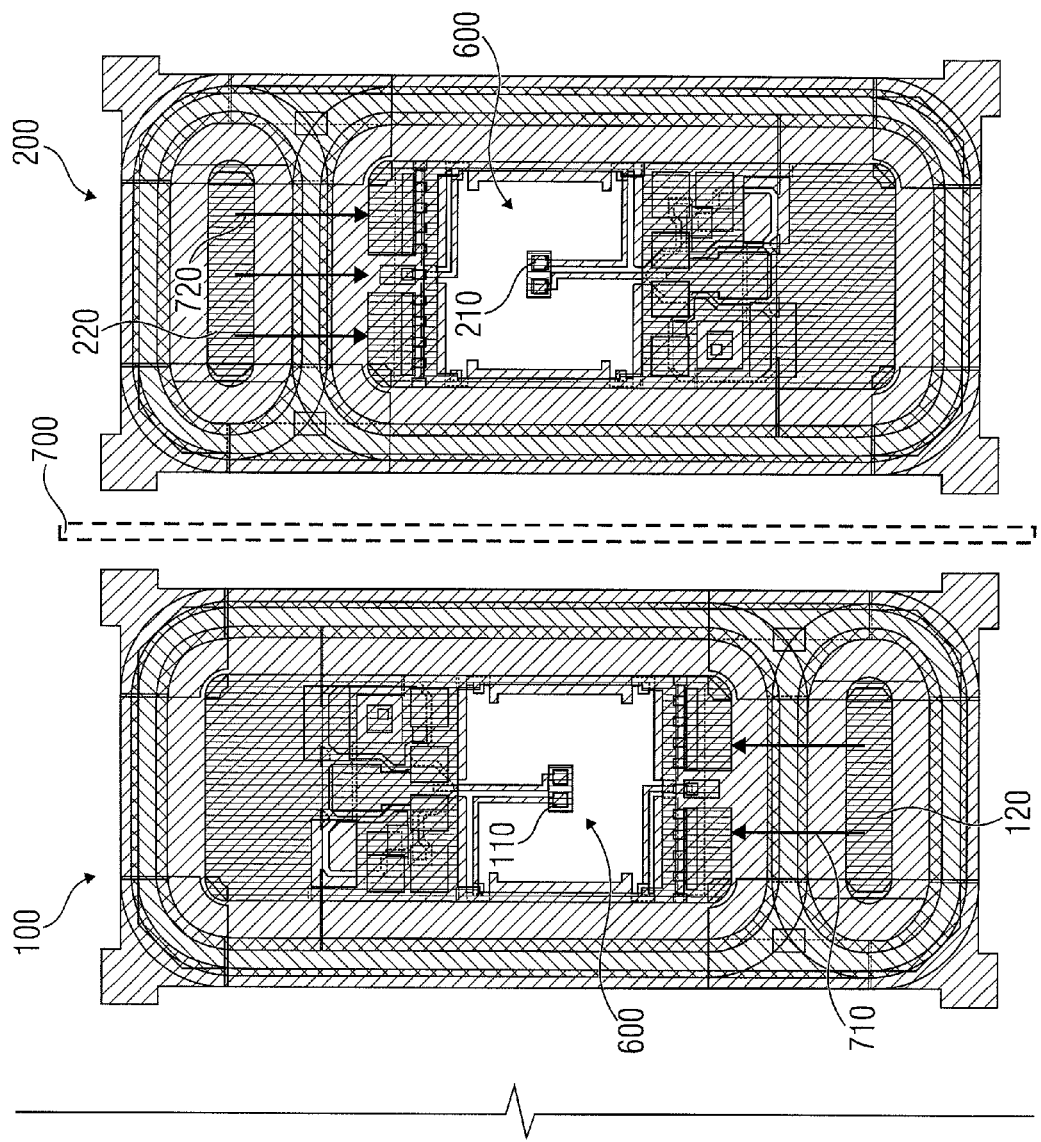

FIG. 7 shows a comparison to a conventional triac also comprising a first thyristor 100 and a second thyristor 200, which are each formed on their own substrate (whereby a mutual influencing from one thyristor to the other thyristor is excluded) and were brought together along the separation line 700. The top views illustrated in FIG. 7 correspond to the top views as are also illustrated in FIG. 6A, so that the first thyristor 100 comprises a first contact terminal 110 and a second contact terminal 120, and the optical window 600 is arranged centrally. Likewise, the second thyristor 100 comprises a first contact terminal 210 and a second contact terminal 220 and also a central optical window 600.

The conventional dual-chip variant is illustrated in FIG. 7 on the right, wherein, for example, the second thyristor 200 (arranged on the right) is switched open, so that from the second contact terminal 220 (e.g., anode) a current flow 720 to the first contact terminal 210 (e.g., cathode) takes place. As the first thyristor 100 and the second thyristor 200 are connected in an anti-parallel way, with this connection the first thyristor is blocked (switched in a reverse direction) so that no current flow between the first contact terminal 110 and the second contact terminal 120 of the first thyristor 100 takes place. Thus, only very few charge carriers are in the proximity of the second contact terminal 120 of the first thyristor 100 which in turn only leads to a short-term delay or blocking of the current flow when the current direction reverses (e.g., after applying an alternating voltage). The electric field lines 710 show the current direction after commutation. In the indicated dual-chip variant, the two photo thyristors are mounted anti-parallely and galvanically separated (each on its own substrate and subsequently mounted together).

On the left side of FIG. 7 the conventional one-chip variant is illustrated, wherein the first thyristor 100 and the second thyristor 200 are arranged conventionally (without the recombination zone 400) on a common substrate 300, so that the separation line 800 illustrates an open silicon strip. According to embodiments of the present invention, the separation strip 800 is used to form, for example, by means of a proton implantation, the recombination zone 400 by recombining free charge carriers. Thus, also on the left side of FIG. 7 the example is shown in which the second thyristor 200 is in a forward direction so that a current flow 720 from the second contact terminal 220 to the first contact terminal 210 takes place. The first thyristor 100 is in this example again in a blocking direction.

A disadvantage of this conventional arrangement, in which the second thyristor 200 and the first thyristor 100 are next to each other on a common substrate 300 and no recombination zone 400 is implemented according to embodiments of the present invention, is the charge carrier diffusion 820 from the second thyristor 200 to the first thyristor 100, i.e. in particular the diffusion of the free charge carriers from the base zone of the first thyristor to the base zone of the second thyristor. This diffusion of the charge carriers 820 along the diffusion path leads to the fact that, in the area of the first thyristor 100, more charge carriers accumulate (as is, for example, the case on the right side of the 2-chip solution) and thus with a commutation of the current flow a clearly increased delay or blocking of the first thyristor 100 results. First of all, the accumulated charge carriers have to be reduced. The drift of the charge carriers along the diffusion path 820 may, for example, comprise a speed of 1 mm per second, so that after a short time the charge carriers accumulate at the inactive thyristor and delay the blocking operation. The electric field lines 710 again indicate the field direction after commutation.

According to embodiments, now the already existing open silicon strip 800 is used to generate a recombination zone 400 (for example, by a proton irradiation or electron irradiation) which causes an efficient suppression of the diffusion of the free charge carriers along the drift path 820.

The first thyristor 100 and the second thyristor 200 on the substrate 300 may, for example, comprise a distance b which is, for example, 150 μm or in a range between 50 and 500 μm. The distance b may, for example, be defined as the distance of the first doped area 130 of the first thyristor 100 and the first doped area 230 of the second thyristor 200, wherein the measurement may be executed along the substrate surface 310.

Further details illustrated in FIG. 7 for example, comprise additional ignition thyristors or also further small circuits. An oxide layer 340 implemented on the substrate surface 310 may, for example, comprise a thickness of 5 μm or lie in a range between 1-20 μm and be implemented as a field plate.

Embodiments thus include both a structure (new semiconductor device) and also a method for manufacturing the structure or the semiconductor device. The structure here includes the recombination zone 400 in the area between the two thyristors 100, 200, for example, connected in an anti-parallel way. Optionally, also deep trenches or pores may be implemented, for example, filled with oxide, metal or polysilicon, or also unfilled. Thus, in further embodiments, the recombination zone 400 may also be replaced by a trench or by pores or by a trench structure, wherein the trenches are either open or may be filled with a dielectric material like, for example, an oxide. Optionally, it is also possible to combine the recombination zone 400 with further trenches (which may again be open or filled with oxide) at the substrate surface 310 in order to suppress the charge carrier drift more efficiently. In principle, the described method may also be applied on other structures comprising parallel, anti-parallel or serially connected semiconductor devices or power semiconductors on a chip.

Embodiments may, for example, be applied within optocouplers, wherein a galvanic separation of two signal paths is achieved by an intermediate optical transmission of the signal. The optical signal is here coupled via the optical window 600 to the current path between the first and the second terminal 110, 120 of the first thyristor 100 (or analog for the second thyristor 200), so that this current path may be controlled via the optical window.

Embodiments include, in particular, two controlled bipolar devices connected in an anti-parallel way, like, for example, two thyristors connected into a triac. The lateral extension may, for example, be 1.5×1.5 mm and the vertical extension 500 μm. According to embodiments, a secure switching up to a frequency of 100 Hz is possible with a blocking capability up to 800 V. The substrate doping may, for example, be selected such that a resistance between 30 and 500 ohm*cm results. The basic extension may, for example, lie in a range between 30 μm and 1,000 μm.

Although some aspects were described in connection with the semiconductor device, it is obvious that these aspects also represent a description of the corresponding method, so that a block or a part of the device may also be regarded as a corresponding method step or as a feature of a method step. Analog to that, aspects described in connection with or as being a method step also represent a description of a corresponding block or detail or feature of a corresponding device.

Depending on certain implementation requirements, embodiments of the invention may be implemented in part or completely in hardware or in software. The implementation may be executed using a digital storage medium, for example a floppy disc, a DVD, a Blu-ray disc, a CD, an ROM, a PROM, an EPROM, an EEPROM or a FLASH memory, a hard disc or another magnetic or optical memory on which electronically readable control signals are stored which may cooperate or do cooperate with a programmable computer system such that the respective method is executed. Thus, the digital storage medium may be computer-readable. Some embodiments according to the invention thus include a data carrier comprising electronically readable control signals which are able to cooperate with a programmable computer system such that a method described herein is executed.

In some embodiments, a programmable logic device (for example, a field-programmable gate array, an FPGA) may be used to execute some or all functionalities of the methods described herein. In some embodiments, a field-programmable gate array may cooperate with a microprocessor to execute one of the methods described herein. Generally, in some embodiments, the methods are executed by any hardware device. The same may be a universally usable hardware like a computer processor (CPU) or specific hardware for the method, like, for example, an ASIC.

The above-described embodiments only represent an illustration of the principles of the present invention. It is obvious that modifications and variations of the arrangements and details described herein are obvious for other persons skilled in the art. It is thus the intention that the invention only be limited by the scope of the following patent claims and not by the specific details presented herein with respect to the description and the explanation of the embodiments.

What is claimed is:

1. A semiconductor device, comprising:
   a substrate comprising a first major surface at a front side and a second major surface at a back-side opposite the front side;
   a first device comprising a first semiconductor material region and disposed in the substrate at the front side;
   a second device comprising a second semiconductor material region and disposed in the substrate laterally adjacent the first device;
   a recombination zone comprising a third semiconductor material region and disposed in the substrate, the third semiconductor material region being a different material than the first semiconductor material region and the second semiconductor material region, the recombination zone extending in to the substrate from the first major surface of the substrate, the recombination zone being disposed between the first device and the second device; and
   a back-side recombination layer comprising a fourth semiconductor material region and disposed at the second major surface of the substrate.

2. The semiconductor device according to claim 1, wherein the first device comprises a first terminal and a second terminal and the second device comprises a first terminal and a second terminal,
   wherein the first terminal and the second terminal of the first device and the first terminal and the second terminal of the second device are accessible to be contacted from a common surface of the substrate.

3. The semiconductor device according to claim 1, wherein the first device and the second device are coupled in an anti-parallel manner.

4. The semiconductor device according to claim 1, wherein the recombination zone comprises lattice defects of the substrate and wherein the lattice defects form recombination centers for the recombination of diffusing charge carriers.

5. The semiconductor device according to claim 1, wherein the back-side recombination layer comprises crystal lattice defects caused by a back-side irradiation, so that the back-side recombination layer comprises a higher recombination rate than the substrate.

6. The semiconductor device according to claim 1, further comprising at least one trench along a back surface, the back surface opposite a front surface that includes the recombination zone, wherein the trench and the recombination zone run at least partially in parallel.

7. The semiconductor device according to claim 6, wherein the recombination zone comprises a depth and wherein the trench contacts the recombination zone.

8. The semiconductor device according to claim 1, wherein the recombination zone comprises a depth and wherein the back-side recombination layer contacts the recombination zone so that a drift path of the diffusing charge carriers is interrupted.

9. The semiconductor device according to claim 1, wherein the recombination zone comprises a trench and/or pores, wherein the trench and/or the pores are open or at least partially filled with an oxide.

10. The semiconductor device according to claim 1, wherein the first device includes a first thyristor and the second device includes a second thyristor of the same setup as the first thyristor.

11. The semiconductor device according to claim 1, wherein the first device and the second device are coupled in a parallel manner.

12. The semiconductor device according to claim 1, the recombination zone is disposed so that diffusing charge carriers recombine between the first device and the second device.

13. A method for manufacturing a semiconductor device, the method comprising:
   forming a first device comprising a first semiconductor material region and a second device comprising a second semiconductor material region in a substrate comprising a first major surface and an opposite second major surface such that the first device and the second device are arranged laterally next to each other at a substrate surface;
   forming a recombination zone comprising a third semiconductor material region and disposed at the first major surface, the third semiconductor material region being a different material than the first semiconductor material region and the second semiconductor material region, the recombination zone extending in to the substrate, the recombination zone disposed between the first device and the second device, so that diffusing charge carriers recombine between the first device and the second device; and
   forming a back-side recombination layer comprising a fourth semiconductor material region and disposed at the second major surface of the substrate.

14. The method according to claim 13, wherein forming the recombination zone comprises a masked proton, helium or electron irradiation leading to the formation of recombination-effective crystal lattice defects in the substrate.

15. The method according to claim 14, wherein forming the recombination zone further includes annealing the recombination-effective defects by a temperature treatment, wherein the annealing comprises exposing the substrate with the recombination zone to a temperature below 350° C.

16. The method according to claim 13, wherein forming the recombination zone comprises using protons with an energy between 1 MeV and 6 MeV and/or a dose of $10^{12}$ to $10^{14}$ protons per $cm^2$.

17. The method according to claim 13, wherein forming the recombination zone comprises diffusing heavy metals.

18. The method according to claim 17, further comprising performing a temperature treatment with a temperature between 700 and 900° C.

19. The method according to claim 13, further comprising forming a trench at a back side of the substrate, the back side lying opposite the substrate surface.

20. The method according to claim 13, wherein forming a back-side recombination layer comprises performing a back-side irradiation of the substrate, wherein the back-side irradiation is executed on a back side of the substrate opposite to the substrate surface below both the first device and the second device and also below the recombination zone.

21. The method according to claim 20, wherein the back-side irradiation comprises a proton irradiation.

22. A semiconductor device, comprising:
   a substrate comprising a first major surface and an opposite second major surface;
   a first device disposed in the substrate at the first major surface;
   a second device disposed in the substrate laterally adjacent the first device at the first major surface; and
   a recombination zone comprising heavy metals in a semiconductor material region disposed in the substrate, the recombination zone extending from the first major surface into the substrate, the recombination zone disposed between the first device and the second device; and a back-side recombination layer comprising the semiconductor material region and disposed at the second major surface of the substrate.

23. The semiconductor device according to claim 22, wherein the heavy metals comprise gold or platinum.

24. The semiconductor device according to claim 22, wherein the recombination zone is disposed so that diffusing charge carriers recombine between the first device and the second device.

25. A semiconductor device, comprising:
- a substrate comprising a first major surface and an opposite second major surface;
- a first photo thyristor comprising a first semiconductor material region and disposed in the substrate;
- a second photo thyristor comprising a second semiconductor material region and disposed in the substrate laterally adjacent the first photo thyristor; and
- a recombination zone comprising a third semiconductor material region and disposed in the substrate, the third semiconductor material region being a different material than the first semiconductor material region and the second semiconductor material region, the third semiconductor material region extending in to the substrate from the first major surface, and disposed between the first photo thyristor and the second photo thyristor; and
- a back-side recombination layer comprising a fourth semiconductor material region and disposed at the second major surface of the substrate.

26. The semiconductor device according to claim 25, wherein the recombination zone further comprises heavy metals in the semiconductor material.

27. The semiconductor device according to claim 25, wherein the recombination zone is disposed so that diffusing charge carriers recombine between the first photo thyristor and the second photo thyristor.

* * * * *